(12) United States Patent
Jeung et al.

(10) Patent No.: US 8,504,646 B2
(45) Date of Patent: Aug. 6, 2013

(54) DATA TRANSFER BETWEEN MOTORS

(75) Inventors: Young-Chun Jeung, Cypress, CA (US); Thomas Earl Cain, Costa Mesa, CA (US)

(73) Assignee: Sntech, Inc., Phoenix, AZ (US)

( * ) Notice: Subject to any disclaimer, the term of this patent is extended or adjusted under 35 U.S.C. 154(b) by 717 days.

(21) Appl. No.: 12/490,229

(22) Filed: Jun. 23, 2009

(65) Prior Publication Data

US 2009/0315498 A1    Dec. 24, 2009

Related U.S. Application Data

(60) Provisional application No. 61/074,983, filed on Jun. 23, 2008, provisional application No. 61/074,974, filed on Jun. 23, 2008.

(51) Int. Cl.

| | |
|---|---|
| *G06F 15/167* | (2006.01) |
| *G06F 15/16* | (2006.01) |
| *G06F 15/173* | (2006.01) |
| *G06F 7/00* | (2006.01) |
| *G06F 17/00* | (2006.01) |
| *G06F 19/00* | (2011.01) |
| *G06F 9/44* | (2006.01) |
| *G06F 9/445* | (2006.01) |
| *B60Q 1/00* | (2006.01) |
| *F01D 5/14* | (2006.01) |
| *F01D 25/26* | (2006.01) |

(52) U.S. Cl.
USPC ........... 709/217; 709/212; 709/223; 340/438; 415/115; 415/138; 701/1; 701/3; 701/103; 701/115; 717/168; 717/174

(58) Field of Classification Search
None
See application file for complete search history.

(56) References Cited

U.S. PATENT DOCUMENTS

| | | | |
|---|---|---|---|
| 3,299,335 A | | 1/1967 | Wessels |
| 3,760,232 A | * | 9/1973 | Swindell ..................... 361/832 |
| 4,525,763 A | | 6/1985 | Hardy et al. |
| 4,696,619 A | * | 9/1987 | Lardellier .................... 415/138 |
| 4,774,448 A | | 9/1988 | Yoshitomi |
| 4,888,530 A | | 12/1989 | Radik et al. |

(Continued)

FOREIGN PATENT DOCUMENTS

| | | |
|---|---|---|
| JP | 2005-168241 | 6/2005 |
| KR | 10-2008-0019807 | 3/2008 |

OTHER PUBLICATIONS

"Engine Swap is there an ECU change too", automotiveforums.com; Jun. 15, 2007-Jun. 18, 2007, http://www.automotiveforums.com/t716173-engine_swap_is_there_an_ecu_change_too_.html, Sep. 10, 2012.*

(Continued)

*Primary Examiner* — Ario Etienne
*Assistant Examiner* — Ho Shiu
(74) *Attorney, Agent, or Firm* — Knobbe Martens Olson & Bear LLP

(57) ABSTRACT

A method for transferring existing data from a source motor to a target motor includes retrieving the existing data from the source motor, optionally converting the existing data into a new format, and at least one of storing, erasing, writing, overwriting, or replacing software and/or data on the target motor such that the existing data is stored on the target motor in a format compatible with the target motor.

31 Claims, 5 Drawing Sheets

U.S. PATENT DOCUMENTS

| | | | | |
|---|---|---|---|---|
| 5,375,972 | A * | 12/1994 | Gray | 415/115 |
| 5,767,635 | A | 6/1998 | Steffens et al. | |
| 6,026,342 | A * | 2/2000 | Graf et al. | 701/51 |
| 6,199,018 | B1 * | 3/2001 | Quist et al. | 702/34 |
| 6,374,161 | B1 * | 4/2002 | Iwai et al. | 701/1 |
| 6,625,622 | B1 * | 9/2003 | Henrickson et al. | 1/1 |
| 6,758,051 | B2 | 7/2004 | Jayanth et al. | |
| 6,956,344 | B2 | 10/2005 | Robertson et al. | |
| 6,995,539 | B1 | 2/2006 | Hansson et al. | |
| 7,050,939 | B2 | 5/2006 | Palmer et al. | |
| 7,104,851 | B1 * | 9/2006 | Gonring et al. | 440/1 |
| 7,243,270 | B2 | 7/2007 | Taniguchi et al. | |
| 7,290,450 | B2 | 11/2007 | Brown et al. | |
| 7,363,129 | B1 * | 4/2008 | Barnicle et al. | 701/1 |
| 7,383,474 | B2 | 6/2008 | Sekizawa | |
| 7,730,161 | B2 * | 6/2010 | Baumann | 709/217 |
| 7,747,797 | B2 * | 6/2010 | Abraham et al. | 710/62 |
| 2002/0020968 | A1 * | 2/2002 | Gail et al. | 277/355 |
| 2002/0047348 | A1 | 4/2002 | Ohiwa et al. | |
| 2002/0117986 | A1 | 8/2002 | Becerra et al. | |
| 2002/0178243 | A1 * | 11/2002 | Collins | 709/223 |
| 2003/0001442 | A1 | 1/2003 | Hsu | |
| 2003/0092437 | A1 * | 5/2003 | Nowlin et al. | 455/420 |
| 2003/0101140 | A1 * | 5/2003 | So et al. | 705/51 |
| 2003/0173924 | A1 | 9/2003 | Blase et al. | |
| 2003/0200274 | A1 * | 10/2003 | Henrickson et al. | 709/212 |
| 2003/0212931 | A1 * | 11/2003 | Hetrick et al. | 714/710 |
| 2004/0128203 | A1 * | 7/2004 | Pierre et al. | 705/26 |
| 2004/0204902 | A1 | 10/2004 | Kokubo et al. | |
| 2005/0076264 | A1 * | 4/2005 | Rowan et al. | 714/6 |
| 2005/0122213 | A1 * | 6/2005 | Kawanishi et al. | 340/438 |
| 2005/0132136 | A1 * | 6/2005 | Inoue et al. | 711/114 |
| 2005/0197750 | A1 * | 9/2005 | MacDougall | 701/3 |
| 2005/0210317 | A1 * | 9/2005 | Thorpe et al. | 714/6 |
| 2006/0010436 | A1 * | 1/2006 | Henrickson et al. | 717/168 |
| 2006/0101040 | A1 | 5/2006 | Ren et al. | 707/100 |
| 2006/0212747 | A1 * | 9/2006 | Okamoto et al. | 714/6 |
| 2006/0275127 | A1 * | 12/2006 | Borufka et al. | 416/203 |
| 2007/0086098 | A1 | 4/2007 | Sekiguchi et al. | |
| 2007/0093934 | A1 * | 4/2007 | Garneau, III | 700/236 |
| 2007/0150891 | A1 * | 6/2007 | Shapiro | 717/174 |
| 2007/0234348 | A1 * | 10/2007 | Kelso et al. | 717/174 |
| 2008/0084171 | A1 | 4/2008 | Leehey et al. | |
| 2008/0195299 | A1 * | 8/2008 | Barnicle et al. | 701/115 |
| 2009/0063115 | A1 * | 3/2009 | Lu et al. | 703/8 |
| 2009/0118899 | A1 * | 5/2009 | Carlson | 701/35 |
| 2009/0209128 | A1 * | 8/2009 | Mullin | 439/502 |
| 2009/0315494 | A1 | 12/2009 | Jeung et al. | |
| 2009/0315496 | A1 | 12/2009 | Jeung et al. | |
| 2009/0315497 | A1 | 12/2009 | Jeung et al. | |
| 2010/0103859 | A1 * | 4/2010 | Isoyama | 370/315 |
| 2010/0119864 | A1 * | 5/2010 | Ochiai et al. | 428/610 |
| 2010/0174469 | A1 * | 7/2010 | Vannucci Oliveira et al. | 701/103 |
| 2010/0198447 | A1 * | 8/2010 | Maier et al. | 701/29 |
| 2011/0048027 | A1 * | 3/2011 | Waldhorn | 60/776 |

OTHER PUBLICATIONS

International Search Report and Written Opinion dated Feb. 10, 2010 for Application No. PCT/US2009/048333, filed Jun. 23, 2009.

* cited by examiner

DATA TRANSFER BETWEEN MOTORS

CROSS-REFERENCE TO RELATED APPLICATIONS

This application claims the benefit under 35 U.S.C. §119 (e) of U.S. Provisional Patent Application No. 61/074,983, filed Jun. 23, 2008, titled DATA TRANSFER BETWEEN MOTORS, and U.S. Provisional Patent Application No. 61/074,974, filed Jun. 23, 2008, titled OPTIMIZATION OF MOTOR OPERATION USING A TEST CYCLE. The entire contents of each of the above-referenced applications are incorporated by reference herein and made a part of this specification.

BACKGROUND

1. Field

The present disclosure relates to the field of electronic control systems for motors and to systems and methods for transferring operational parameters between motors, in particular.

2. Description of Related Art

Some motors use electronic control systems to regulate and optimize their operation. Electronic control systems can include software that monitors and/or selects various operational parameters of the motor. For example, some types of motors can be optimized for the load placed on the motor and/or the particular environment in which a motor operates. Data about the particular environment and the load are stored in various formats using data models that typically vary among motor manufacturers.

SUMMARY

Some embodiments provide a method for transferring data between motors. The method can include connecting a source motor to a target motor; accessing data stored in a first memory device of the source motor; analyzing the data to determine whether the data is in a first format usable by an electronic control system of a target motor; converting the data into the first format usable by the electronic control system of the target motor when it is determined that the data is in a format other than the first format; and storing the data on a second memory device of the target motor in the first format.

In certain embodiments, the data includes at least one operational parameter stored in the first memory device when the source motor is manufactured. The at least one operational parameter can include a power factor, an RPM value, a service factor, a voltage magnitude, or a full load current magnitude. The data can also include at least one operational parameter generated after the source motor is installed at a worksite. The at least one operational parameter can include data about a load applied to the source motor, data about a thermal environment in which the source motor is operated, data about torque generated by the source motor; or data about friction in the environment of the source motor.

In some embodiments, connecting a source motor to a target motor includes connecting the source motor to a transfer device and connecting the transfer device to the target motor, connecting a cable between the source motor to the target motor, or connecting the source motor to a data network and connecting the target motor to the same data network. Connecting the source motor to a data network can include using a motor interface separate from the source motor to facilitate a connection between the source motor and the data network.

In certain embodiments, the target motor includes a data transfer device. Connecting the source motor to the data transfer device can include connecting the source motor to the target motor. Alternatively, the data transfer device can be a device, separate from a motor, specially designed to facilitate a transfer of data between motors.

In some embodiments, converting the plurality of operational parameters includes translating operational parameters from a first data model to a second data model different from the first data model. Converting the plurality of operational parameters can include accessing a library of data relating to field codes used by various motor manufacturers.

Additional embodiments provide another method for transferring data between motors. The method can include connecting a source motor to a data transfer device; retrieving operational parameters stored in a memory of the source motor; and storing the operational parameters in a format compatible with a target motor.

In some embodiments, the method includes running the target motor using the operational parameters from the source motor. The data transfer device can include the target motor. The data transfer device can also include a device, apart from the target motor, configured to facilitate a transfer of data between motors.

In certain embodiments, storing the operational parameters in a format compatible with a target motor includes converting the operational parameters from a first data model to a second data model. Storing the operational parameters in a format compatible with a target motor can include determining whether the operational parameters need conversion and converting the operational parameters into a format usable by an electronic control system of the target motor when it is determined that the operational parameters need conversion. Determining whether the operational parameters need conversion can include querying the target motor to identify a data model usable by the target motor.

Additional embodiments provide a motor including a rotor; a stator; and an electronic control system that regulates the operation of at least one of the stator or the rotor. The electronic control system can include a processor; a memory connected to the processor; and program instructions executable by the processor and stored in the memory. The motor can further include a data transfer interface configured to connect the processor to a source memory device and a data transfer library that includes information for converting operational parameters from a source data model into a target data model different from the source data model. The program instructions can be configured to cause the electronic control system to access data stored in the source memory device; use the data transfer library to generate converted data by converting the data into a data model compatible with the electronic control system; and store the converted data in the memory.

In some embodiments, the source memory device is a memory device of a source motor. The source memory device can be a memory device of a device storing operational parameters of another motor. The motor can include an electric power supply connected to the electronic control system.

In certain embodiments, the data stored in the source memory device can include operational parameters generated by a source electronic control system of the source motor after installation of the source motor and/or operational parameters stored on the source motor at the time of manufacture.

Further embodiments provide a motor including a rotor; a stator; and an electronic control system that regulates the operation of at least one of the stator or the rotor. The electronic control system can include a processor; a memory connected to the processor; one or more operational parameters stored in the memory; and program instructions executable by the processor and stored in the memory. The motor can further include a data transfer interface configured to connect the processor to a data transfer device. The program instructions can be configured to cause the electronic control system to establish a data connection with the data transfer device; access the operational parameters stored in the memory; transmit information to the data transfer device regarding a data model used by the electronic control system for storing the operational parameters; and transmit the operational parameters to the data transfer device.

In some embodiments, the electronic control system further includes a data recovery system configured to store data in a manner that the data can be accessed when at least some components of the electronic control system have failed, a backup memory device that stores a copy of the data stored in the memory, and/or a backup power supply configured to provide power to the memory when a primary power supply cannot provide power to the memory.

In certain embodiments, the electronic control system is configured to receive information from the data transfer device regarding a target data model compatible with control software running on a target motor, create translated operational parameters by mapping the operational parameters onto the target data model, and transmit the translated operational parameters to the data transfer device.

Additional embodiments provide an apparatus for facilitating a transfer of data from a source motor to a target motor. The apparatus can include a data transfer interface configured to connect the apparatus to a motor memory device; a processor connected to the data transfer interface; and a translation module. The translation module can include instructions executable by the processor to determine whether a source data model used by the source motor is compatible with a target data model used by the target motor and convert a source data structure into a target data structure compatible with the target data model when it is determined that the source data model is not compatible with the target data model. The apparatus can further include a data transfer module. The data transfer module can include instructions executable by the processor to receive the source data structure from the source motor; generate the target data structure using the translation module; and transfer the target data structure to the target motor.

In some embodiments, the data transfer interface is configured to connect to at least one of the source motor or the target motor over a data network. The data transfer interface can include a wireless data network interface.

In certain embodiments, the translation module is configured to use a field name library to map data in the source data structure to data fields in the target data structure.

In some embodiments, the apparatus further includes a motor identification module configured to identify a data model used by a particular motor. The motor identification module can be configured to electronically query the motor in order to identify the data model used by the motor. The motor identification module can include instructions executable by the processor to request motor identification information, receive the requested motor identification information, compare the motor identification information with data about particular motors in a motor identification library to identify a matching motor, and based on the comparison, identify a data model associated with the matching motor. The data transfer module can be configured to use the motor identification module to identify the source data model and/or the target data model.

In certain embodiments, the apparatus further includes a motor configuration utility that installs motor control software on the target motor.

Further embodiments provide a system for transferring data between motors. The system can include a source motor and a target motor. The source motor can include a source memory device storing source motor control software; a source motor electronic control system configured to execute the source motor control software on a source processor; and at least one source data structure stored in the source memory device. The target motor can include a target memory device storing target motor control software and a target motor electronic control system configured to execute the target motor control software on a target processor. The system can include a data transfer interface configured to receive the at least one source data structure from the source motor and transfer at least a portion of the at least one source data structure to the target motor.

In some embodiments, the data transfer interface includes a cable connecting the source motor to the target motor and/or a wireless data connection between the source motor and the target motor.

In certain embodiments, the data transfer interface includes a data transfer device separate from the source motor and the target motor. The data transfer device can facilitate a transfer of data from the source motor to the target motor. The data transfer device can be configured to be connected to the source motor and the target motor simultaneously. The data transfer device can also be configured to be connected to the source motor and the target motor sequentially. The data transfer device can include a translation module configured to convert the source data structure into a data model compatible with the target motor electronic control system.

In some embodiments, the source data structure includes operational parameters used by the source motor electronic control system to govern operation of the source motor.

In certain embodiments, the source motor initiates a transfer of data by pushing data to the target motor. Alternatively, the target motor can initiate a transfer of data by requesting data from the source motor. The target motor can include a switch configured to allow a person to initiate a transfer of data from the source motor by activating the switch.

In some embodiments, the source motor and the target motor use a standardized data model. Alternatively, the source motor and/or target motor can include a translation module configured to convert the source data structure into a data model compatible with the target motor electronic control system. The target motor can include an interpreter configured to allow the target motor electronic control system to use the source data structure when the source data structure employs one of a preselected plurality of data models.

DETAILED DESCRIPTION OF PREFERRED EMBODIMENTS

The embodiments described herein provide systems and methods for transferring data between motors. For example, in certain embodiments, a motor includes electronic components and connections, one or more memory devices for storing software and data (including, for example, operational parameters, a motor control module, and/or a data transfer module), and a data transfer interface (for example, a data port) for accessing, replacing, deleting, or creating the software or data stored in the memory devices. A motor data transfer involves at least two motors: a source motor that supplies the data to be transferred and a target motor that receives the transferred data. In some embodiments, the target motor is a new motor that is intended to replace the source motor. Motor data transfers can involve multiple source motors and/or multiple target motors.

Some embodiments provide an easy-to-use system for transferring operational parameters or other data from a source motor to a target motor. Certain embodiments provide an apparatus that assists in the transfer of data between motors. Additional embodiments provide a motor that is configured to obtain operational parameters from another motor. Some embodiments provide a method for transferring data from an existing motor to a target motor using automatic or semi-automatic motor identification techniques. In some embodiments, the transfer of operational parameters between motors can be accomplished without substantial assistance from a motor manufacturer. Operational parameters capable of being transferred between motors can include, for example, power factor, RPM, service factor, voltage, current, torque, load, and friction. The operational parameters associated with a motor can include user-oriented parameters (for example, parameters generated after installation of a motor). User-oriented parameters can include data about a load on which a motor operates, data about the thermal environment of a motor, data about torque generated by a motor, or data about friction in the environment of a motor. The operational parameters associated with a motor can also include manufacturer-oriented parameters (for example, parameters stored at the time when a motor is manufactured). Manufacturer-oriented parameters can include power factor, RPM, service factor, voltage, or full load current.

Motor Overview

Figure 1:
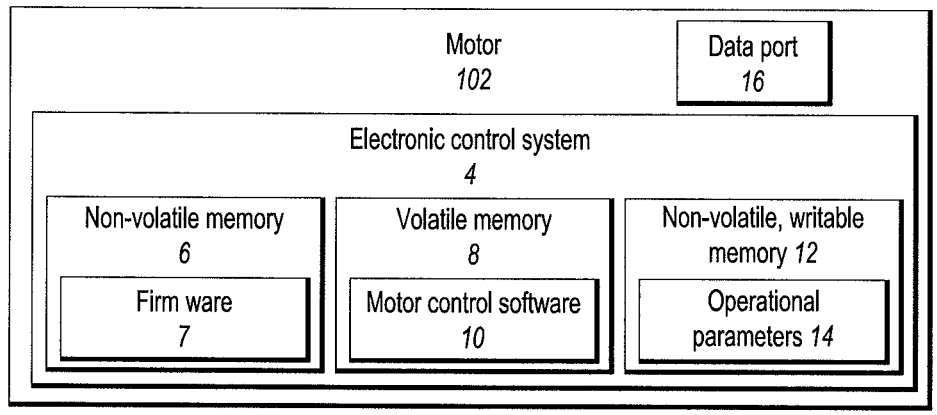
FIG. 1 is a schematic diagram of a motor having an electronic control system and a data port.

FIG. 1 shows a motor 102 that includes an electronic control system 4. In the embodiment shown in FIG. 1, the electronic control system 4 includes a non-volatile memory 6 for storing motor firmware 7, a volatile memory 8 to provide a working memory space for software, such as, for example, motor control software 10, and a non-volatile writable memory 12 available to the software 10 to maintain up-to-date operational parameters 14. In some embodiments, one or more of the components of the electronic control system 4 can be embedded on a single circuit. For example, the motor firmware 7 and the operational parameters 14 can be stored on a single non-volatile memory device.

The electronic control system 4 controls one or more aspects of the operation of the motor 102. For example, the control system 4 can regulate the flow of energy to an electric motor. The term "electric motor" is used broadly herein and refers to the mechanical and/or software components of a motor that convert electric energy into mechanical energy. For example, mechanical components of an electric motor can include a rotor and a stator. The electronic control system 4 can use one or more operational parameters to govern its control of one or more of the mechanical components during motor operation.

The motor 102 shown in FIG. 1 includes a data port 16 that provides access to data used by the electronic control system 4. For example, the data port 16 can provide access to a writable memory 12 in which operational parameters 14 are stored. The data port 16 can include any suitable interface or connector. In some embodiments, the data port 16 uses a proprietary interface, such as, for example, an interface used across a family of motors made by a single manufacturer. In certain embodiments, the data port 16 uses a standardized interface, such as, for example, a data interface agreed to by multiple motor manufacturers and/or an industry group. Examples of communications interfaces that may be used include a MODBUS interface, a USB interface, a wired interface, a wireless interface, or a data network communications link. In some embodiments, the data port 16 incorporates security features, such as a passcode feature that restricts access to data maintained by the electronic control system 4.

The motor 102 can also include one or more interfaces to other equipment (not shown). For example, the motor 102 may be connected to equipment with a controller or control board that sends signals to the motor 102. In some embodiments, the motor 102 is connected to a control system for an HVAC system. The motor 102 accepts signals from the control system. Information obtained from the signals is used by the electronic control system 4 and/or stored in memory. Different types of motors use and store information received from a control board in a variety of ways, and it may be desirable to transfer the information to a target motor when the existing motor connected to the control board is replaced.

Data Transfer Between Motors

Figure 2:
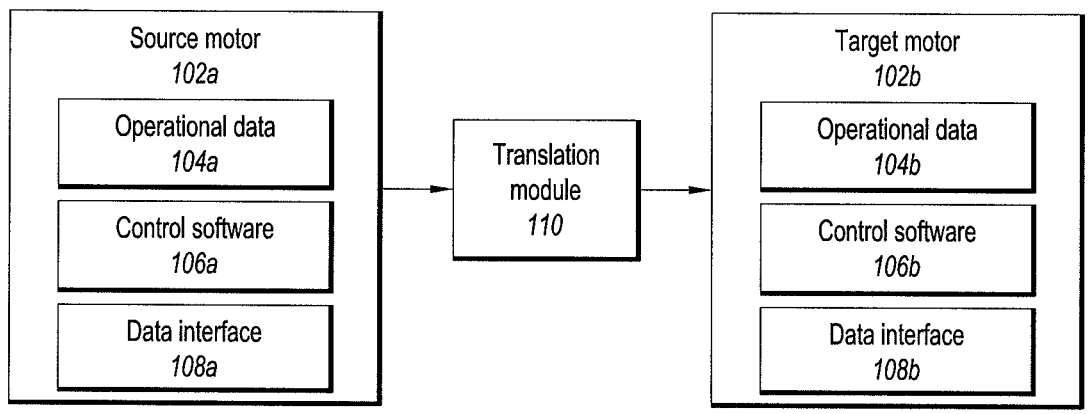
FIG. 2 illustrates a flow of data in a system for transferring data between motors.

FIG. 2 illustrates a flow of data in a system for transferring software and/or data from a source motor 102a to a target motor 102b. In some embodiments, the source motor 102a has existing operational data 104a, control software 106a for the source motor 102a, and a data interface 108a that provides access to the operational data 104a and/or the control software 106a. The existing operational data 104a can include data or parameters that have been optimized for a particular environment or load with which the source motor 102a has operated. The operational data 104a can also include data or parameters stored on the source motor 102a at the time of manufacture.

In the embodiment shown in FIG. 2, the operational data 104a is transferred to a target motor 102b, which has control software 106b that is possibly different from the control software 106a for the source motor 102a. A data transfer module is configured to establish a data connection between the source motor 102a and the target motor 102b, access the operational data 104a and/or the control software 106a stored on the source motor 102a, and analyze the data and/or software to determine whether the data is usable by an electronic control system of the target motor 102b. The data transfer module can be implemented by one of the motors or by a separate data transfer device using any suitable hardware, software, or combination of hardware and software. The data transfer module can include a data translation module 110, which is used to convert the operational data 104a from a format used by the source motor 102a into corresponding operational data 104b that is compatible with the software 106b and/or other components of the target motor 102b. The translation module 110 can be integrated with the data transfer module or implemented in a separate device. For example, the translation module 10 can be embedded in the target motor 102b, in the source motor 102a, and/or in another device independent of the data transfer module.

A data interface 108b provides access to one or more storage devices where the operational data 104b and/or control software 106b reside on the target motor 102b. The data interface 108b for the target motor may differ from the data interface 108a for the source motor. In some embodiments, the target motor 102b is configured to access operating data 104a on the source motor 102a and transfer the operating data 104a to the target motor 102b. In some embodiments, the target motor 102b is configured to convert the operating data 104a on the source motor 102a into a format compatible with the target motor 102b.

In some embodiments, a system for transferring software and/or data from the source motor 102a to the target motor 102b allows an end user, a motor technician, a motor dealer, one who obtains a motor from the motor manufacturer, or another person to perform the transfer. In some embodiments, the transfer between the source motor and the target motor can be accomplished without the assistance of the motor manufacturer. In certain embodiments, the data transfer system transfers information received by the source motor 102a via a control board or control system.

In some embodiments, the source motor 102a or the target motor 102b includes one or more features that increase the likelihood that a transfer of data from the source motor 102a to the target motor 102b will be successful. For example, a motor can include a robust data storage system having at least one of a data recovery system, a backup memory, or a backup power supply. The data storage system can help to ensure that data stored in the source motor 102a remains accessible. For example, the data recovery system can be configured to store data in a manner that the data can be accessed even when some components of the electronic control system have failed. The backup memory can be configured to maintain operating parameters in a memory device that maintains data integrity for an extended period of time (e.g., for a longer period of time than the main non-volatile memory) and/or provides redundancy by mirroring data stored in another memory device. Any suitable non-volatile storage medium, including, for example, PROM, EPROM, EEPROM, flash memory, FeRAM, or MRAM, may be used as principal or backup storage for operating parameters or other data. In some embodiments, the data storage system is configured to perform backups of the motor operating data continuously, periodically, or intermittently. The backup power supply can include any suitable power source for powering the memory device(s) present in the data storage system when the motor's primary power supply cannot provide power to one or more components of the data storage system.

Figure 3:
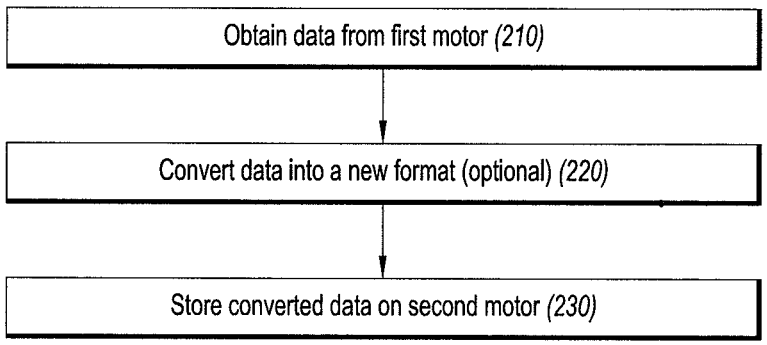
FIG. 3 illustrates an embodiment of a method for transferring data between motors.

FIG. 3 illustrates a method for transferring existing software and/or data from a source motor 102a to a target motor 102b. The method includes retrieving existing data from the source motor (210), optionally converting the existing data into a new format compatible with the target motor (220), and at least one of storing, erasing, writing, overwriting, or replacing data and/or software on the target motor such that the existing data and/or software is stored in a memory device of the target motor in a format compatible with the electronic control system of the target motor (230). In some embodiments, converting the existing software and/or data into a new format includes mapping data from a first data model to a second data model. In certain embodiments, a data model includes field codes associated with the types of data in the data model and units for associating the data values with physical quantities. In some embodiments, the operational data is converted into a new format when the data model used by the target motor is different from the data model used by the source motor.

Figure 4:
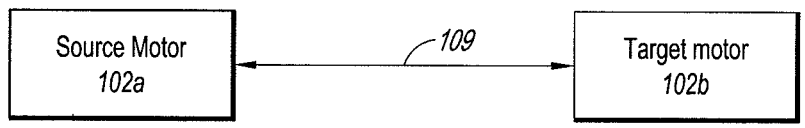
FIG. 4 is a schematic diagram of an embodiment of a system for transferring data between motors.

In some embodiments, data is transferred between motors without a third device. In the embodiment shown in FIG. 4, a cable 109 or another suitable connector connects the source motor 102a and the target motor 102b. In some embodiments, the target motor reads the existing software and/or data from the source motor. In some embodiments, the target motor is directly connected to the source motor via the cable 109. In alternative embodiments, the target motor is indirectly connected to the source motor via a network connection, via a wireless connection, by transferring a memory device from the source motor to a memory device reader connected to the target motor, or by another suitable connection. In some embodiments, the source motor 102a, the target motor 102b, or both motors can include a translation module 110 (FIG. 2).

Data Transfer Through Another Device

As described above, in certain embodiments, a motor 102 has built-in functionality for obtaining data from another motor. In alternative embodiments, another device performs the data transfer or assists in performing the data transfer. The device can be specially designed to facilitate a transfer of data between motors.

Figure 5:
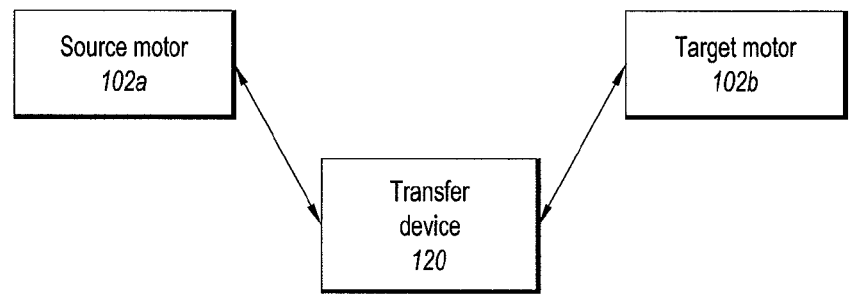
FIG. 5 is a schematic diagram of another embodiment of a system for transferring data between motors.

In the embodiment shown in FIG. 5, a transfer device 120 separate from a motor is used to transfer data from the source motor 102a to the target motor 102b. The transfer device 120 can include one or more data transfer interfaces for establishing a data connection with the source motor 102a and/or the target motor 102b. Suitable connectors, such as, for example, one or more cables, can be used to connect the transfer device 120 to the source motor 102a and the target motor 102b. Alternatively, the transfer device 120 can use other connection types, such as, for example, a network connection, a wireless connection, and/or any suitable data port connection, to communicate with the motors 102a-b. In some embodiments, the transfer device 120 is a standalone device. For example, the transfer device 120 can be a unitary machine that is designed to be used in a motor repair or replacement facility. The transfer device 120 can be configured to communicate with several different motor models and/or motors made by several different motor manufacturers. In certain embodiments, the transfer device 120 is embodied by software running on a computer. In some embodiments, the transfer device 120 is embodied on a centralized computer connected to a motor replacement location by, for example, a data network. The transfer device 120 can be configured to convert operational data from a format used by the source motor 102a to a format compatible with the target motor 102b.

The source motor 102a and the target motor 102b can be connected to the transfer device 120 at the same time. For example, a system in which both motors 102a-b are simultaneously connected to the transfer device 120 can permit a real-time transfer of data from the source motor 102a to the target motor 102b via the transfer device 120. Alternatively, fewer than all of the motors involved in a data transfer can be connected to the transfer device at the same time. For example, one motor may be connected to the transfer device 120 at a time, as illustrated by the following sequence: the source motor 102a is connected to the transfer device 120, the transfer device 120 receives a source data structure from the source motor 102a, the source motor 102a is disconnected, the target motor 102b is connected to the transfer device 120, and the transfer device transfers a target data structure to the target motor 102b.

Certain embodiments provide a method of transferring data from a source motor 102a to a target motor 102b via a transfer device 120. The method can include establishing a connection between the transfer device 120 and the source motor 102a. Data from the source motor 102a is transferred to the transfer device 120. A connection between the transfer device 120 and the target motor 102b is established. Data is transferred from the transfer device 120 to the target motor 102b. In some embodiments, the transfer device 120 is configured with two or more interfaces to establish communications links with different kinds of motors. The interface can be designed to provide simplified access to the data stored in the motors by, for example, reducing the need for adapters between different types of interfaces.

In certain embodiments, the transfer device 120 includes a motor configuration utility that installs software and/or copies data to a target motor. The motor configuration utility provides access to a motor configuration library, which stores data, information, or software associated with a variety of different motor types and/or associated with motors operated in a variety of different environments. In such embodiments, the data transfer device 120 can be configured to load operational parameters or motor operation software, such as, for example, parameters or software similar to or the same as those used by the source motor 102a, onto the target motor 102b. Thus, software or data can be written from the transfer device 120 to the target motor 102b without retrieving the software or data from the source motor 102a. The data and software to be loaded on the target motor 102b can be selected by a user of the data transfer device 120, by a selection algorithm, or by any other suitable means. For example, the data transfer device 120 can be configured to detect the type or model of the target motor 102b and select suitable software. In some embodiments, a user of the transfer device 120 specifies the load and/or other operational parameters, and the transfer device 120 automatically detects the type or model of the target motor 102b. The transfer device 120 then writes data to the target motor 102b that is customized to the operating environment and the motor configuration.

In some embodiments, the transfer device 120 includes a motor identification module that identifies a data model used by a particular motor's electronic control system. The motor identification module can include a user interface through which a user can provide identification information for the source motor 102a and/or the target motor 102b before or during a data transfer session. In certain embodiments, the user interface can also accept information about the operating environment and/or operational parameters of the motors. The user interface can include one or more input and output devices, such as, for example, a display, buttons, switches, a keyboard, a touch screen, a pointing device, a bar code reader, an RFID tag reader, an image capture device, an audio capture device, or another suitable device for converting information into a machine-recognizable form. The identification information provided by a user can be used to look up the source motor 102a and/or the target motor 102b in a motor identification library containing information that connects the identification information to a particular make and model of motor and/or a particular data model used by an electronic control system of a motor.

In certain embodiments, as an alternative or in addition to any identification information provided by a user, the motor identification module of the transfer device 120 is configured to sense, test, query, or probe a motor 102 to identify the type, manufacturer, or data model of the motor to which the transfer device 120 is connected. For example, the motor 102 can be configured to respond to an identification query. The transfer device 120 can also be configured to test the properties of the data port 16 to determine motor identification or configuration information. The motor configuration information can be used to assist in the data transfer and/or conversion process. In some embodiments, the library of motor configuration information is stored locally, such as, for example, on the transfer device 120. In alternative embodiments, the library of motor configuration information is remotely accessed, such as, for example, over a network.

Data Transfer Over a Network

Figure 6:
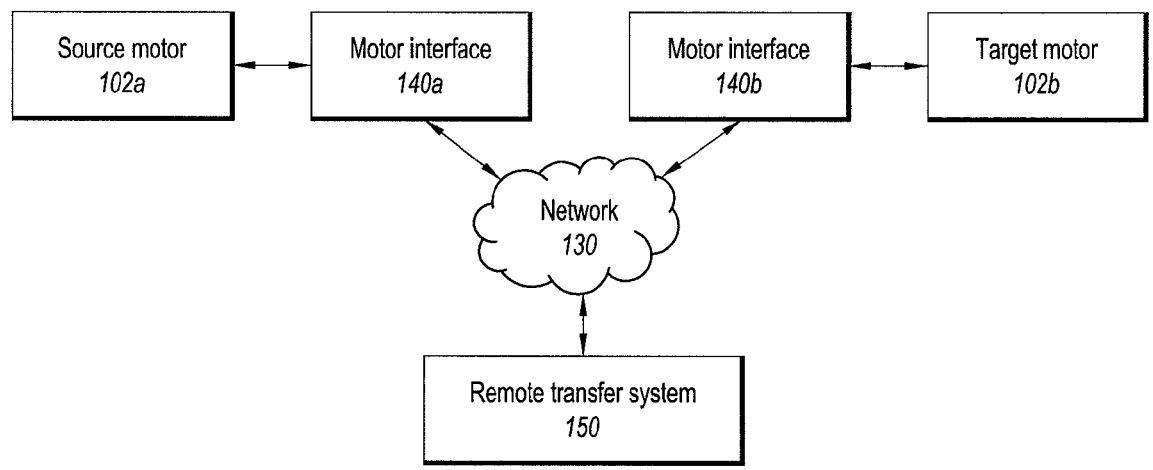
FIG. 6 is a schematic diagram of a further embodiment of a system for transferring data between motors.

In the embodiment shown in FIG. 6, a data network 130 is used to facilitate communications between motors 102a-b and a remote transfer system 150. In some embodiments, one or more motor interfaces 140a-b are used to facilitate connection between the motors 102a-b and the network 130. The interfaces can be integrated with the motors or separate from the motors. In some embodiments, the motor interfaces 140a-b include a connector configured to connect a motor data port to a data network connection or bus, such as, for example, a USB port, a MODBUS port, an Ethernet port, a wireless network connection, an IEEE 1394 port, or another suitable network connection.

The remote transfer system 150 can include a motor identification module that assists in identifying the source motor 102a and the target motor 102b. For example, the remote transfer system 150 can be configured to identify one or both motors 102a-b involved in a data transfer using information stored in a motor identification library. The motor identification library can include a database of identifying information for motors of a variety of makes and models. In some embodiments, the motor identification module includes program code for determining attributes of a data model used by a motor's electronic control system or another identifying characteristic of a motor. The motor identification module can use this information to determine whether the motors involved in a data transfer use different data models. If it is determined that different data models are used, a data transfer module can be used to convert data stored in the supply motor into a format compatible with the receiving motor.

In some embodiments, the motor identification module prompts a user to provide identifying information about the source motor 102a and/or the target motor 102b to assist in identification of the motors. For example, the motor identification module may prompt a user for information if an automatic motor identification process cannot precisely identify the source and target motors. The motor identification module may also prompt a user for information at the beginning of an automatic or semi-automatic motor identification process. In some embodiments, the remote transfer system 150 converts or translates data from one data model to a different data model during the data transfer when it is determined that the source and target motors use different or incompatible data models.

Data stored in the source motor 102a can include data stored in a filled-value table. The values in the table may be associated with field names or codes that are selected by the motor manufacturer or by the designer of a control system for the source motor 102a. In some embodiments, the data transfer system includes a library of data relating to field names and/or codes used in motor data tables. In some embodiments, the library includes a computer database that is updated continuously, periodically, or intermittently with information about newly available motors or new data models. The information in the field name library can be used to map data represented by data fields and values from the source motor 102a to fields and values associated with the target motor 102b. In some embodiments, the library of data includes conversion constants or algorithms for converting values from those stored in the table of the source motor 102a to values consistent with the data model used by the target motor 102b.

Example Data Transfer Configurations

Figure 7:
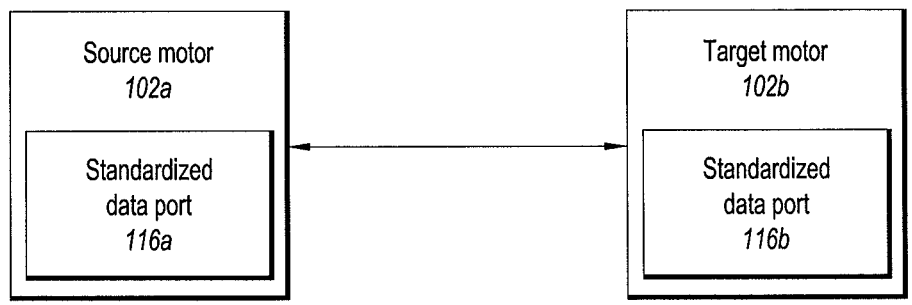
FIG. 7 is a schematic diagram of an embodiment of a data transfer system using data ports.

In the embodiment shown in FIG. 7, a source motor 102a and a target motor 102b include standardized data ports 116a-b. A standardized data port 116 can include software and/or a connection interface that simplify transfer of data between motors. In some embodiments, when a cable is connected between motors with standardized data ports, data can be transferred between the motors without translation or conversion of data. In certain embodiments, a substantially automatic transfer of data from the source motor 102a to the target motor 102b can be accomplished by attaching a cable between standardized data ports 116a-b and initiating a transfer. A transfer can be initiated by any suitable process or interface. For example, a motor can include a switch or other suitable user interface element for initiating a transfer of data from another motor.

The transfer of data can occur in a variety of different ways. In some embodiments, the source motor 102a is configured to initiate the transfer of data by sending or pushing data to the target motor 102b. In alternative embodiments, the target motor 102b is configured to initiate the transfer of data by requesting or pulling data from the source motor 102a. In some embodiments, the target motor 102b includes a conversion database for translating data from a format used by the source motor 102a into a format used by the target motor 102b. In certain embodiments, the target motor 102b rearranges and/or converts data in a filled-value table received from the source motor 102a into a format that corresponds with a data model used by the target motor 102b. In additional embodiments, the target motor 102b includes an electronic control system with an emulator or a hardware abstraction layer that allows the target motor 102b to use the operational parameters received from the source motor 102a without substantial modifications.

In some embodiments, a motor with a standardized data port uses a data model in common with other motors having a standardized data port. The standardized data model for operating parameters can be used by a variety of motor manufacturers. The standardized data model can facilitate data transfer and reduce or eliminate the need for data translation or conversion during the data transfer process. In some embodiments, the standardized data model includes at least one of a standard data format, a standard set of data fields, and a standard set of units for values in a table of operational parameters.

Figure 8:
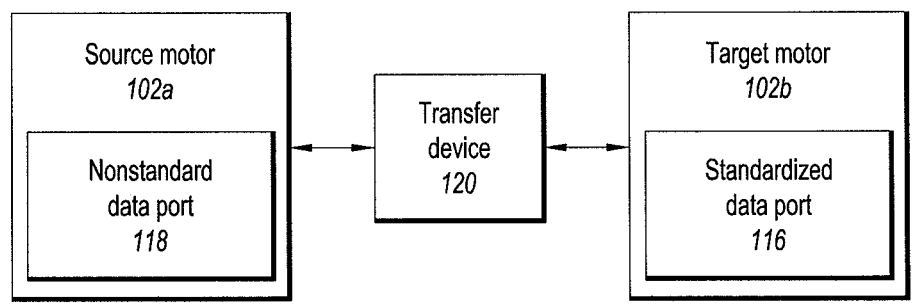
FIG. 8 is a schematic diagram of another embodiment of a data transfer system using data ports.

In the embodiment shown in FIG. 8, the target motor 102b includes a standardized data port 116, and the source motor 102a includes a nonstandard data port 118. A transfer device 120 can optionally be used to transfer data between the source motor 102a and the target motor 102b. The transfer device 120 can include a plurality of interfaces capable of connecting to standardized and nonstandard data ports. In some embodiments, the transfer device 120 includes a translation module 110 (FIG. 2) that translates operating parameters between a data model used by the source motor 102a and a data model used by the target motor 102b. In some instances, the translation of data may be imperfect. In some embodiments, the transfer device 120 and/or the target motor 102b includes an interpreter and/or an abstraction layer configured to allow operating parameters associated with multiple data models to be used or translated.

In some embodiments, the target motor 102b used the standardized data port 116 to pull data from the source motor 102a and convert the data, as necessary, without the need for an intervening transfer device 120. In such embodiments, the data port 116 can be configured to provide power to certain portions of the source motor 102a and/or access data recovery systems in the source motor 102a in order to increase the likelihood that data can be recovered from the source motor 102a. Furthermore, in such embodiments, the target motor 102b can include a translation module 110 (FIG. 2) that translates operating parameters between a data model used by the source motor 102a and a data model used by the target motor 102b.

In certain embodiments, the target motor 102b includes a data transfer module. The data transfer module can include instructions executable by the processor to receive a source data structure from the source motor 102a, create a target data structure, and store the target data structure in a memory device. In such embodiments, the target motor 102b can accomplish a transfer a data from the source motor 102a without the aid of a separate transfer device 120.

Figure 9:
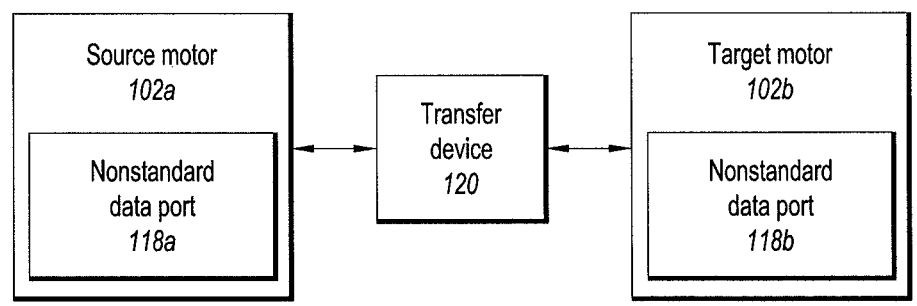
FIG. 9 is a schematic diagram of a further embodiment of a data transfer system using data ports.

In the embodiment shown in FIG. 9, the source motor 102a and the target motor 102b include nonstandard data ports 118a-b. In the embodiment shown in FIG. 9, a transfer device 120 is used to transfer data between the source motor 102a and the target motor 102b. The transfer device 120 can include a plurality of interfaces capable of connecting to various nonstandard data ports. In certain embodiments, the transfer device 120 is configured to request or pull data from the source motor 102a via the nonstandard data port 118a. In some embodiments, the transfer device 120 is configured to send, push, or supply data to the target motor 102b via the nonstandard data port 118b. In some embodiments, the transfer device 120 relies on information supplied by the user to held identify the motors that are involved in a data transfer. The identity of the motors can be used in the data transfer or data conversion process to make the transfer more reliable. In certain embodiments, the transfer device 120 probes the motors to determine motor identification and/or configuration information. The transfer device can be configured to supply power to a nonstandard data port 118 and access motor data recovery systems.

Example Pricing Structures

A variety of pricing structures may be used with a data transfer system. For example, an end user or service provider can be charged a flat fee, a subscription fee, and/or individual fees for particular transfer operations. In some embodiments, data transfer functionality can be installed on a motor for a fee. In some embodiments, the transfer device 120 is a device that can be licensed, rented, or sold. For example, the transfer device 120 can be a standalone device intended for use at the location of a customer or a remote device accessible by the customer over a data network. In certain embodiments, the transfer device 120 includes software or hardware for metering use of the device such that a customer can be charged, for example, for every use of the device. In some embodiments, the transfer device 120 is configured to be used with a customized cable with a metering device embedded in the cable that maintains a record of the number of times the device is used to transfer data between motors. Other suitable systems for metering use of the transfer device 120 can be used to enable flexible pricing options for the device. The dealers and operators of a data transfer system can make any suitable arrangement to divide the fees collected for data transfer services.

Optimizing Motor Operation

Some embodiments provide systems and methods for optimizing motor operation. In the context of this disclosure, "optimizing motor operation" can include selecting a mode of operation, selecting a control program, and/or adjusting operating parameters used by a selected control program. For example, in certain embodiments, an electronic control system for a motor uses a test cycle to select an optimum mode of operation from a plurality of available modes of operation. The test cycle can produce test data that is compared to information in a library of operating parameters relating to the available modes of operation. Information from the library of operating parameters can be fed into an algorithm that chooses an optimum mode of operation.

In certain embodiments, the test cycle tries each of a plurality of available modes of operation, monitors operational parameters, and determines the best performing mode of operation. In some embodiments, the best performing or optimum mode of operation delivers adequate power output, adequate motor speed, decreased energy consumption, decreased heat generation, another desired attribute of motor operation, or a combination of desired attributes. In some embodiments, the test cycle changes one or more operational parameters while monitoring changes in other parameters. In certain embodiments, the test cycle changes controllable parameters while monitoring other parameters that are affected by the changes. The test cycle can also be used to select or optimize operating parameters within a selected mode of operation.

Figure 10:
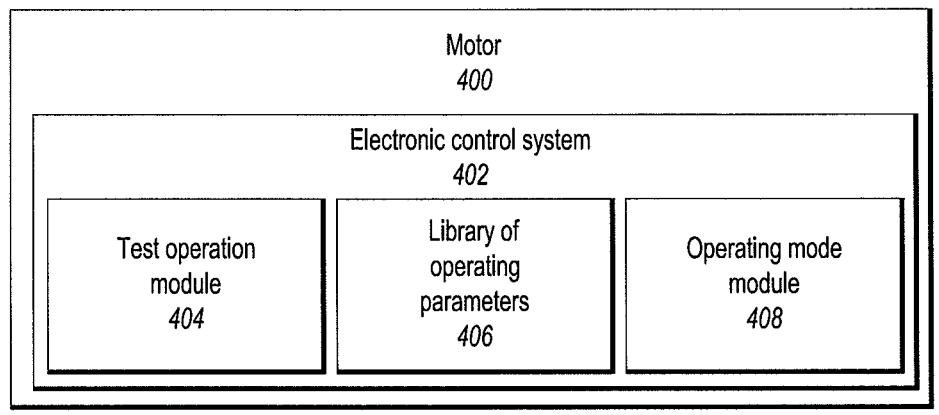
FIG. 10 is a schematic diagram of data and software stored in an electronic control system of a motor.

FIG. 10 shows a motor 400 that includes an electronic control system 402 configured to optimize operation of the motor 400 based on the operating environment. The electronic control system 402 includes a test operation module 404 configured to collect operational data during a motor test cycle. Operational data collected during the test cycle can include a component temperature, load, power output, motor speed (e.g., RPM), electric current, initial torque, shaft resistance, timing information (e.g., time required to reach a target motor speed), and other operating parameters. The operating parameters acquired during the test operation are compared to information in a data library 406 that includes information for selecting a mode of operation for the motor based on test operation results. For example, the data library 406 can include optimum ranges for motor operating parameters (for example, ranges for at least some of the operational data values collected during the test cycle) associated with each mode of operation available to the motor 400. The electronic control system 402 includes an operating mode module 408 to implement one or more modes of operation. For example, the motor control software 10 (FIG. 1) may implement the modes of operation. An algorithm can be used to map the test operation results to an optimum mode of operation. The electronic control system 402 selects the optimum mode of operation available to the motor 400.

In certain embodiments, the test operation module 404 conducts a test cycle that includes testing at least some of the available modes of operation and monitoring operating parameters for each of the tested modes of operation. The operating parameters associated with each tested mode of operation are compared to optimal values and/or ranges of values for the parameters. In some embodiments, information about optimal values and optimal ranges of values for the operating parameters is stored in the library of operating parameters 406. As an alternative or addition to the information in the library 406, a user, a manufacturer, a service technician, or another person can specify optimal values or ranges. The test operation module 404 selects an optimum mode of operation based on the comparison between the test cycle data associated with each tested mode of operation and the optimum values or ranges.

In some embodiments, the test operation module 404 conducts a test cycle that includes changing one or more particular operational parameters (e.g., controlled parameters) and monitoring changes in other operational parameters. During the test cycle, the test operation module 404 gathers data for the other operational parameters associated with multiple independent controlled parameter values. After the test cycle, the test operation module 404 selects a mode of operation that includes setting one or more operational parameters of the motor to an optimal level to produce desired values for other operational parameters. For example, the test cycle may show that a particular motor speed produces desirable values for power output, energy consumption, and heat generation. The optimum mode of operation may include operating the motor at the particular motor speed.

In certain embodiments, the test operation module 404 includes sensors or transducers for gathering data during the test cycle and during motor operation. For example, a sensor (such as, for example, a hall effect sensor) can be used to detect the position of the stator relative to the rotor of the motor 400. As another example, a sensor can be used to detect the load on the motor 400 by, for example, comparing the position of the rotor and the current input into the motor 400. One of skill in the art will recognize that operating data can be gathered in various other ways that are known in the art. Any suitable techniques can be used to gather operating data during the test cycle and at other times during operation of the motor 400.

In some embodiments, a method of selecting a mode of operation for a motor 400 includes providing a library of operating parameter ranges mapped to a plurality of operation modes, performing a test operation to collect motor operational data, using a library of operating parameters 406 to evaluate a plurality of operating modes in view of the motor operational data, and using an algorithm to select an optimum mode of operation for the motor 400. In some embodiments, the test operation is performed automatically and/or manually, for example, when the motor 400 is started. Additionally, the test operation can be performed at various times during operation of the motor, such as, for example, periodically, intermittently, at the time that the motor is installed, just one time, or whenever changes in the load or operating environment occur.

In certain embodiments, a method of optimizing the operation of a motor 400 includes performing a test operation to adjust operating parameters used in a selected mode of operation. In some embodiments, additional optimization of motor operation can be obtained by performing a second test cycle at a time after a first test operation is used to select a mode of operation.

Figure 11:
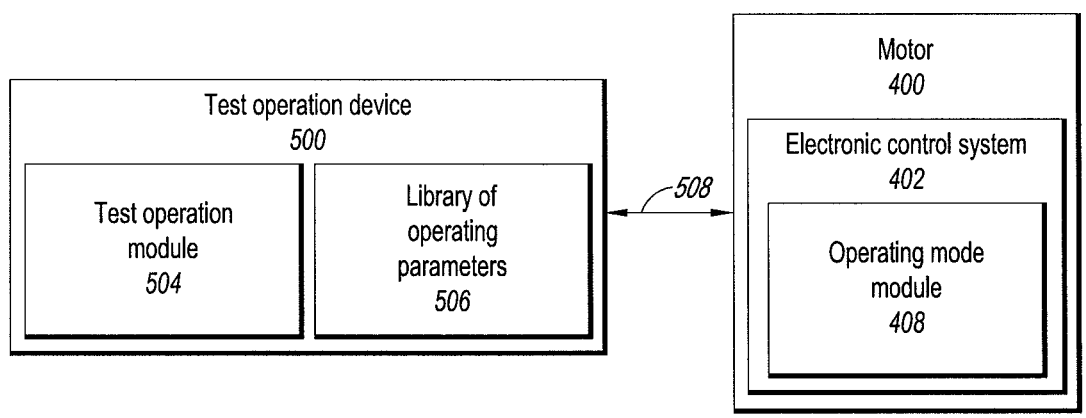
FIG. 11 is a schematic diagram of a motor connected to a test operation device.

In the embodiment shown in FIG. 11, a test operation device 500, which provides test cycle and/or motor operation optimization functionality, is operatively connected to a motor 400. A control interface 508 can allow the test operation device 500 to communicate with and issue instructions to an electronic control system 402 of the motor 400. The test operation device 500 includes a test operation module 504 that can be configured to automatically or manually perform a test cycle when the device 500 is connected to the motor 400. In some embodiments, the test operation module 504 is configured to acquire or sense data that indicate the response of the motor 400 to the test cycle. The test operation module 504 can then use information from a library of operating parameters 506 to optimize the operation of the motor 400, as discussed previously. The test operation device 500 can also include a program module for loading one or more control programs onto the motor 400. For example, the test operation device 500 may detect that an adequate or optimum control program is not loaded in the operating mode module 408 of the motor 400. In such an instance, the device 500 can be configured to send or install a new control program to the motor 400. The test operation device 500 can also be configured to implement at least some of the other features discussed herein as being implemented by the motor 400.

Test Operation Architecture

In some embodiments, the electronic control system 402 includes memory that stores one or more control programs. Each control program can correspond to a different mode of operation for the motor 400. In certain embodiments, the motor 400 includes functionality for storing, retrieving, copying, replacing, and erasing control programs on a memory device. For example, the control programs can be implemented by the operating mode module 408, and the operating mode module 408 can interface with a data port 16 (FIG. 1) of the motor 400 via a data connection.

A motor 400 incorporating operating mode optimization functionality can be manufactured in any suitable way. For example, in some embodiments, a manufacturer of the motor 400 provides a control circuit and memory associated with the electronic control system 402. The manufacturer installs test operation software (e.g., including test operation module 404) into the memory. Alternatively, the manufacturer can provide an application-specific integrated circuit, a field-programmable gate array, a complex programmable logic device, test operation hardware, test operation firmware, or another suitable technology for implementing the test operation module 404 in the motor 400.

In certain embodiments, the motor manufacturer installs mode of operation software, mode of operation firmware, a control program, or hardware in the electronic control system 402. As an alternative or in addition to any control programs installed by the manufacturer, an end user, a service technician, or another person can install software or hardware for implementing a mode of operation. In some embodiments, software or hardware implementing multiple modes of operation is installed (for example, as part of the operating mode module 408). The electronic control system 402 selects at least one of the multiple modes of operation for use with the motor 400 in a particular operating environment. A control program can include data for inclusion in the library of operating parameters 406. For example, optimum operational parameter data ranges for using a mode of operation can accompany the control program that implements the mode of operation.

In some embodiments, the electronic control system 402 includes functionality for determining when a control program being used by the motor 400 is inadequate or suboptimal (for example, due to a change in the motor's operating environment). For example, the test operation module 404 can include this functionality. In certain embodiments, the test operation module 404 implements a user interface that prompts a user to initiate a test operation cycle when, for example, a suboptimal value for an operational parameter is detected. In some embodiments, a user interface is provided that allows a user to initiate a test operation cycle. The user interface can include a display connected to a data port of the motor 400, a visual indicator connected to the motor or to a control panel associated with the motor (for example, a gauge, a lamp, or an LED), an audio indicator (for example, a loudspeaker, a bell, or another sound generating device), or another suitable user interface element.

In certain embodiments, a method of selecting an optimum mode of operation for the motor 400 includes operating the motor using a preselected mode of operation. For example, the manufacturer can select a default mode, or a user can select a mode of operation when starting the motor. The test operating module 404 monitors motor operation, including one or more operational parameters that may change with the environment in which the motor operates. During operation of the motor 400, the test operating module 404 detects that an operational parameter falls outside a desired range associated with the preselected mode of operation. A test operation cycle is initiated. For example, the test operating module 404 can automatically initiate a test operation, a user can initiate a test operation, or the test operating module 404 can prompt the user to initiate a test operation. Operational data for the motor 400 is collected, and a new mode of operation is selected based on the test cycle data. The new mode of operation is better optimized for the load or other factors associated with the environment in which the motor 400 operates.

In some embodiments, a motor includes a processor and a computer-readable medium encoded with instructions for selecting an optimum mode of operation (such as, for example, at least some portions of the methods for selecting an optimum mode of operation described above).

Test Operation Methods

A suitable method can be used to select an optimum mode of operation based on operational data collected during a test cycle (for example, test cycle results). In some embodiments, a method for optimizing motor performance includes running the test cycle and accessing the library of operating parameters 406 to evaluate the test cycle results. The library of operating parameters 406 can include desired ranges for one or more types of operational data and/or other evaluation criteria for one or more modes of operation implemented by the operation mode module 408. A weighting, which may be associated with the importance of the parameter, can be assigned for each type of operational data. For example, the load on a motor may be more important for selecting an optimum mode of operation than the ambient temperature.

In some embodiments, the operating mode module 408 uses the algorithm to select an optimum mode of operation from a plurality of available modes of operation. In certain embodiments, the module 408 determines whether the test cycle parameters are outside desired ranges associated with a mode of operation for each of the parameters. If a test cycle parameter is outside the desired range, the module 408 calculates a weighting based on how far the parameter lies outside the desired range. The module 408 sums the weightings for each parameter and uses the result to determine a score for each available mode of operation. The optimum mode of operation is selected based on the score.

In some embodiments, the operating mode module 408 calculates an index or score based on a comparison between the test value for each parameter and one or more optimum value(s) for the parameter associated with a mode of operation. The index is multiplied by a weighting based on the importance of the parameter to produce a weighted score for the parameter. The weighted scores are summed for all parameters associated with the mode of operation to generate a total score, and the process is repeated for each available mode of operation. An optimum mode of operation is selected by comparing the total scores.

In certain embodiments, a process for selecting an optimum mode of operation includes two or more stages. Such a process may be useful, for example, when a large number of modes of operation are available. In some embodiments, a subset of the available control programs is preselected by a user, by a service technician, by another human, by an algorithm, or in another suitable way. For example, the subset of control programs may be selected using only some of the operating parameters, such as, for example, the most important parameters (e.g., motor speed, RPM, etc.). The test operation module 404 runs a full test cycle to select an optimum mode of operation from only the subset of preselected modes. In some embodiments, multiple rounds of preselecting modes are used to further narrow the number of modes of operation used for the full test cycle. In some embodiments, a finer optimal range is used during the full test cycle for operational parameters used when preselecting modes of operation. For example, if a range for motor speed is used to preselect a subset of available modes of operation, a smaller range for the motor speed can be used during the full test cycle to select an optimal mode of operation from the subset.

Additional Embodiments

An additional embodiment provides a method for transferring data between motors comprising: accessing existing operational parameters from a source motor; converting the operational parameters to a format compatible with a target motor; and transferring the operational parameters to the target motor. In some embodiments, the method comprises connecting a cable from the source motor to the target motor. In some embodiments, the target motor is configured to locate operating data on the source motor and copy the data to the target motor.

A further embodiment provides a method for transferring data between motors comprising: using a transfer device to acquire operational parameters from the source motor, converting the operational parameters to the format compatible with the target motor, and sending the operational parameters to the target motor. In some embodiments, the method comprises connecting a cable from the source motor to the transfer device. In some embodiments, the method comprises connecting a cable from the transfer device to the target motor. In some embodiments, the transfer device has two or more data interfaces to provide easy access to motors having different data port configurations.

In an additional embodiment, a system for transferring data between motors comprises: a processor; and a computer-readable medium encoded with instructions executable by said processor for performing one or more methods for transferring data between motors.

Some embodiments provide a method for selecting a mode of operation for a motor, the method comprising: providing a motor control system with a plurality of available modes of operation; running a test cycle; measuring variations in motor operational parameters during the test cycle; and using test cycle results to select an optimum mode of operation from the plurality of available modes of operation. In some embodiments, the test cycle comprises trying at least some of the available modes of operation. In certain embodiments, selecting an optimum mode of operation comprises comparing the test cycle results to target values or ranges for the motor operational parameters. The plurality of available modes of operation can be pre-loaded on the motor and/or loaded from another device at the time of the test cycle.

Reference throughout this specification to "certain embodiments," "some embodiments," or "an embodiment" means that a particular feature, structure or characteristic described in connection with the embodiment is included in at least some embodiments. Thus, appearances of the phrases "in some embodiments" or "in an embodiment" in various places throughout this specification are not necessarily all referring to the same embodiment and may refer to one or more of the same or different embodiments. Furthermore, the particular features, structures or characteristics may be combined in any suitable manner, as would be apparent to one of ordinary skill in the art from this disclosure, in one or more embodiments.

As used in this application, the terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Similarly, it should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Rather, inventive aspects lie in a combination of fewer than all features of any single foregoing disclosed embodiment.

Embodiments of the disclosed systems and methods may be used and/or implemented with local and/or remote devices, components, and/or modules. The term "remote" may include devices, components, and/or modules not stored locally, for example, not accessible via a local bus. Thus, a remote device may include a device which is physically located in the same room and connected via a device such as a switch or a local area network. In other situations, a remote device may also be located in a separate geographic area, such as, for example, in a different location, building, city, country, and so forth.

Methods and processes described herein may be embodied in, and partially or fully automated via, software code modules executed by one or more general and/or special purpose computers. The word "module" refers to logic embodied in hardware and/or firmware, or to a collection of software instructions, possibly having entry and exit points, written in a programming language, such as, for example, C or C++. A software module may be compiled and linked into an executable program, installed in a dynamically linked library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an erasable programmable read-only memory (EPROM). It will be further appreciated that hardware modules may be comprised of connected logic units, such as gates and flip-flops, and/or may be comprised of programmable units, such as programmable gate arrays, application specific integrated circuits, and/or processors. The modules described herein are preferably implemented as software modules, but may be represented in hardware and/or firmware. Moreover, although in some embodiments a module may be separately compiled, in other embodiments a module may represent a subset of instructions of a separately compiled program, and may not have an interface available to other logical program units.

In certain embodiments, code modules may be implemented and/or stored in any type of computer-readable medium or other computer storage device. In some systems, data (and/or metadata) input to the system, data generated by the system, and/or data used by the system can be stored in any type of computer data repository, such as a relational database and/or flat file system. Any of the systems, methods, and processes described herein may include an interface configured to permit interaction with end users, technicians, service personnel, administrators, other systems, components, programs, and so forth.

Although described in the illustrative context of certain preferred embodiments and examples, it will be understood by those skilled in the art that the disclosure extends beyond the specifically described embodiments to other alternative embodiments and/or uses and obvious modifications and equivalents.

What is claimed is:

1. An apparatus for facilitating a transfer of data from a source motor to a target motor, the apparatus comprising:
    an electronic control system operatively connected to the source motor, wherein the electronic control system uses operational parameters to control the source motor, wherein the operational parameters are adapted to an operating environment of the source motor, and wherein each of the source motor and the target motor has a stator and a rotor;
    a data transfer interface configured to connect the apparatus to a motor memory system;
    a processor connected to the data transfer interface;
    a translation module comprising instructions executable by the processor to:
        determine that a source data model used by the source motor for storing operational parameters is different than a target data model used by the target motor, wherein the source data model used by the source motor is not compatible with the target data model used by the target motor; and
        convert a source data structure comprising at least one of the operational parameters used to control the source motor into a target data structure compatible with the target data model; and
    a data transfer module comprising instructions executable by the processor to:
        receive the source data structure from the source motor;
        generate the target data structure using the translation module and the source data from the source data structure stored in a source motor memory system; and
        transfer the target data structure to the target motor;
        causing the target data structure to be stored in a motor memory system of the target motor such that an electronic control system of the target motor uses the operational parameters of the source motor to control the target motor, wherein the operational parameters are adapted to the operating environment of the source motor.

2. The apparatus of claim 1, wherein the data transfer interface is configured to connect to at least one of the source motor or the target motor over a data network.

3. The apparatus of claim 1, wherein the data transfer interface comprises a wireless data network interface.

4. The apparatus of claim 1, wherein the translation module is configured to use a field name library to map data in the source data structure to data fields in the target data structure.

5. The apparatus of claim 1, further comprising a motor identification module configured to identify a data model used by a particular motor.

6. The apparatus of claim 5, wherein the motor identification module is configured to electronically query the motor in order to identify the data model used by the motor.

7. The apparatus of claim 5, wherein the motor identification module comprises instructions executable by the processor to:
    request motor identification information;
    receive the requested motor identification information;
    compare the motor identification information with data about particular motors in a motor identification library to identify a matching motor; and
    based on the comparison, identify a data model associated with the matching motor.

8. The apparatus of claim 5, wherein the data transfer module is configured to use the motor identification module to identify the source data model.

9. The apparatus of claim 8, wherein the data transfer module is configured to use the motor identification module to identify the target data model.

10. The apparatus of claim 1, further comprising a motor configuration utility that installs motor control software on the target motor.

11. The apparatus of claim 1, wherein the operational parameters within the source data structure include at least one parameter selected from the group consisting of power factor, RPM, service factor, voltage, current, torque, load, and ambient temperature.

12. The apparatus of claim 1, wherein the target data structure is configured to permit the target motor to replace the source motor in the same operational environment as the source motor when the target motor uses operational parameters stored in the target data structure.

13. The apparatus of claim 1, wherein the target data structure comprises the same operational parameters as the source data structure.

14. The apparatus of claim 1, wherein the apparatus is configured to write data to the target motor that is customized to the operating environment.

15. The system of claim 14, wherein the operational parameters used by the target motor electronic control system include at least some of the operational parameters used by the source motor electronic control system after at least a portion of the at least one source data structure is transferred to the target motor.

16. The apparatus of claim 1, wherein the operational parameters that are used for the target motor include parameters optimized for the particular environment of the source motor.

17. A system for transferring data between motors, the system comprising:
    a source motor comprising:
        a rotor;
        a stator;
        a source memory system configured to store source motor control software;
        a source motor electronic control system configured to execute the source motor control software on a source processor, wherein the source motor electronic control system is configured to use operational parameters to control the source motor, wherein the operational parameters are adapted to an operating environment of the source motor; and at least one source data structure stored in the source memory system, wherein the at least one source data structure comprises at least one of the operational parameters used by the source motor electronic control system;

a target motor comprising:
  a rotor;
  a stator;
  a target memory system configured to store target motor control software;
  at least one target data structure stored in the target memory system; and
  a target motor electronic control system configured to execute the target motor control software on a target processor, wherein the target motor electronic control system is configured to use operational parameters adapted to an operating environment of the target motor;

a data transfer interface configured to receive the at least one source data structure from the source motor and transfer at least a portion of the at least one source data structure to the target motor, wherein the source data structure uses a different data model than the target data structure, wherein the data model for the source data structure is not compatible with the data model for the target data structure; and a translation module comprising instructions executable by a processor to:
  determine that a source data model used by the source motor for storing operational parameters is different than a target data model used by the target motor, wherein the source data model used by the source motor is not compatible with the target data model used by the target motor; and
  convert a source data structure comprising at least one of the operational parameters used to control the source motor into a target data structure compatible with the target data model.

18. The system of claim 17, wherein the data transfer interface comprises a cable connecting the source motor to the target motor.

19. The system of claim 17, wherein the data transfer interface comprises a wireless data connection between the source motor and the target motor.

20. The system of claim 17, wherein the data transfer interface comprises a data transfer device separate from the source motor and the target motor, wherein the data transfer device facilitates a transfer of data from the source motor to the target motor.

21. The system of claim 20, wherein the data transfer device is configured to be connected to the source motor and the target motor simultaneously.

22. The system of claim 20, wherein the data transfer device is configured to be connected to the source motor and the target motor sequentially.

23. The system of claim 20, wherein the data transfer device comprises a translation module configured to convert the source data structure into a data model compatible with the target motor electronic control system.

24. The system of claim 17, wherein the source motor initiates a transfer of data by pushing data to the target motor.

25. The system of claim 17, wherein the target motor initiates a transfer of data by requesting data from the source motor.

26. The system of claim 17, wherein the target motor further comprises a switch configured to allow a person to initiate a transfer of data from the source motor by activating the switch.

27. The system of claim 17, wherein the source motor and the target motor use a standardized data model.

28. The system of claim 17, wherein the target motor comprises a translation module configured to convert the source data structure into a data model compatible with the target motor electronic control system.

29. The system of claim 17, wherein the target motor comprises an interpreter configured to allow the target motor electronic control system to use the source data structure when the source data structure employs one of a preselected plurality of data models.

30. The system of claim 17, wherein the target motor is configured to replace the source motor in the same operating environment as the source motor.

31. A method for transferring data between a source motor and a target motor, the method comprising:
  connecting a data transfer interface apparatus to a motor memory system of the source motor, wherein the source motor has an electronic control system that uses operational parameters to control the source motor, wherein the operational parameters are adapted to an operating environment of the source motor;
  identifying a source data model used by the source motor and a target data model used by the target motor;
  determining that the source data model is different than the target data model;
  determining that the source data model is not compatible with the target data model;
  accessing operational parameters used to control the source motor from a source motor memory system:
  converting a source data structure comprising the operational parameters into a target data structure compatible with the target data model;
  transferring the target data structure to the target motor; and
  causing the target data structure to be stored in a motor memory system of the target motor such that an electronic control system of the target motor uses the operational parameters of the source motor to control the target motor, wherein the operational parameters are adapted to the operating environment of the source motor;
  wherein the source motor and the target motor have a stator and a rotor.

* * * * *